United States Patent [19]

Ikenaga

[11] Patent Number: 4,989,156
[45] Date of Patent: Jan. 29, 1991

[54] METHOD OF DRAWING A PATTERN ON WAFER WITH CHARGED BEAM

[75] Inventor: Osamu Ikenaga, Kawasaki, Japan

[73] Assignee: Kabushiki Kaisha Toshiba, Kawasaki, Japan

[21] Appl. No.: 523,829

[22] Filed: May 16, 1990

Related U.S. Application Data

[63] Continuation of Ser. No. 274,688, Nov. 22, 1988, abandoned, which is a continuation of Ser. No. 896,960, Aug. 15, 1986, abandoned.

[30] Foreign Application Priority Data

Aug. 23, 1985 [JP] Japan .................................. 60-185530

[51] Int. Cl.$^5$ .............................................. G06F 15/60
[52] U.S. Cl. .................................... 364/488; 364/491
[58] Field of Search ....................... 364/488, 490, 491; 250/491.1, 492.2, 398, 396

[56] References Cited

U.S. PATENT DOCUMENTS

| | | | |
|---|---|---|---|
| 4,132,898 | 1/1979 | Buelow et al. | 250/492.2 |
| 4,532,598 | 7/1985 | Shibayama et al. | 364/491 |
| 4,586,141 | 4/1986 | Yasuda et al. | 250/396 |
| 4,628,466 | 12/1986 | Tymes | 364/491 |
| 4,692,579 | 9/1987 | Saitou et al. | 250/398 |

FOREIGN PATENT DOCUMENTS

| | | |
|---|---|---|
| 0053225 | 6/1982 | European Pat. Off. |
| 0063429 | 10/1982 | European Pat. Off. |
| 2510816 | 7/1982 | France |
| 2132390 | 7/1982 | United Kingdom |

OTHER PUBLICATIONS

"Electron Beam Lithography System", Precision Machines, 1985, p. 2190.
"Submicrometer Electron-Beam Direct Writing Technology for 1-Mbit DRAM Fabrication", IEEE, 1985, p. 168, T. Matsuda et al.
"Measuring the Performance of the AEBLE-150 Direct-Write E-Beam Lithography Equipment", SPIE, 1985, p. 25, Allen M. Carroll et al.
Patent Abstracts of Japan, vol. 8, No. 250 (E-279)[1687], Nov. 4, 1984; & JP-A-59 125 622 (Fujitsu K.K.), 07-20-84.

Primary Examiner—Parshotam S. Lall
Assistant Examiner—Ellis B. Ramirez
Attorney, Agent, or Firm—Oblon, Spivak, McClelland, Maier & Neustadt

[57] ABSTRACT

It is determined whether a pattern of subfield region having a pattern extending from region which is determined by main deflection width P is included in the frame region of maximum deflection width R (=P+Q), and pattern data of the subfield having a pattern extending into an adjacent frame is processed as data which is included in the range of maximum deflection width R.

3 Claims, 7 Drawing Sheets

METHOD OF DRAWING A PATTERN ON WAFER WITH CHARGED BEAM

This application is a Continuation of application Ser. No. 07/274,688, filed on Nov. 22, 1988, which is a continuation of Application Ser. No. 06/896,960 now abandoned.

BACKGROUND OF THE INVENTION

The present invention relates to a method of drawing a pattern such as a semiconductor IC pattern on a wafer by means of a charged beam using a main deflector having a large beam deflection width and a subdeflector having a small beam deflection width.

Recently, a method of drawing a semiconductor IC pattern with a charged beam by the double deflection system, combining a main deflector having a large deflection width and a subdeflector having a small deflection width, has been developed as a method of drawing a pattern of a semiconductor IC, such as an LSI, on a mask or on a wafer by means of a charged beam, especially an electron beam, with high precision at a high speed. A main deflection width is set to be, e.g., 500 $\mu$m, and a subdeflection width is set to be, e.g., 30 $\mu$m. It is difficult to obtain a high-speed D/A converter of a large number of bits required for a wide deflection scanning range with high precision at a high speed. Therefore, in a system called a double deflection system, a D/A converter of a large number of bits is used to drive the main deflector to position a beam at a reference position in a subdeflection area and then a high-speed D/A converter of a small number of bits is used to drive the subdeflector to draw a pattern. In this system, a beam deflection rate is increased throughout a drawing area and the drawing throughput is expected to be improved.

A typical example of a conventional method of drawing by a double deflection system will now be described with reference to FIG. 1. Referring to FIG. 1, LSI chip area 10 having an LSI pattern formed based on a CAD (Computer Aided Design) output is illustrated. Of the drawing, hatched regions 11 to 13 are pattern regions. Of regions 11 to 13, patterns included in regions 11 and 12 are not repeating type, but region 13 includes repeating type patterns such as memory cells.

First, chip area 10 of FIG. 1 is divided into a plurality of (three, in this case) frame regions 10a, 10b, and 10c each of which is covered by main deflection. Accordingly, widths of frame regions 10a to 10c are respectively determined by maximum deflection widths P1, P2, and P3 of a main deflection beam. Patterns in respective frames 10a to 10c are then divided into a plurality of subfield regions 11a, 11b,..., 12a, 12b,..., and 13a, 13b,...13h covered by subdeflection, as shown in FIG. 2. As is apparent from FIG. 2, since region 11 is completely included in frame region 10a, no problem is posed. In region 12, subfield region 12c is divided into two portions which are included in frames 10a and 10b, respectively, and divided portions of subfield region 12f are included in frames 10b and 10c, respectively. Accordingly, a pattern in subfield region 12c may be undesirably separated into frames 10aan 10b.

FIG. 3 shows an example of division of subfield region 10. In FIG. 3, a very fine pattern 15 with a width on the order of microns, which is included in subfield region 12c, is further divided into two patterns 15a and 15b on the order of submicrons, and processed as pattern data for frames 10a and 10b, respectively. It is very difficult to draw such a very fine pattern on the order of submicrons. Further, patterns 15a and 15b must be drawn independently to form single pattern 15, resulting in increases in the number of patterns to be drawn, the pattern drawing time, and the number of pattern data.

In pattern region 13, as shown in FIG. 4, an identical pattern is repeated in four subfields 13e to 13h. However, pattern 13e-1 in subfield 13e is to be processed as two patterns by frame division. Although four identical patterns are present in the pattern region 13, three identical patterns in subfields 13f to 13h and another pattern in subfield 13e should be processed in frame 10c.

As described above, with the prior art method, when identical patterns are repeatedly drawn with a beam by a double deflection system, regularity of pattern repetition is lost near the frame boundaries. Therefore, pseudo micropatterns on the order of submicrons are formed to make it impossible or difficult to perform precise drawing processing. In addition, the number of drawing figures, the drawing time, and the number of pattern data are increased due to defective frame division of the pattern.

Rapid advances in ICs are expected to lead to micropatterning and an increase in the number of chip patterns in ICs and in time required for processing. Therefore, the above problems typically occur to make it difficult to improve the drawing throughput of a drawing apparatus with an electron beam.

SUMMARY OF THE INVENTION

The object of the present invention is to provide a method of drawing with a charged beam which can prevent the increase in the number of drawing patterns and data and to improve the throughput of the pattern drawing.

The main feature of the present invention is to minimize the number of divided drawing patterns of subfields at the boundary between adjacent frames, to prevent an increase in the number of data, and to improve the throughput and precision of drawing.

Accordingly, there is provided a method of drawing with a charged beam by a double deflection system comprising the steps of processing for dividing an IC chip area into a plurality of frames which are determined by a width of beam deflection of the charged beam optical system, dividing the frames into a plurality of subfields as micro regions, controlling the reference positions of the subfields by a main deflection means, and drawing desired patterns by a subdeflection means so as to draw patterns of all the desired areas, wherein the steps comprise generating subfield data as drawing pattern data in units of subfields from the IC design pattern data, dividing virtually the IC chip area into frames, generating frame data as a group of subfield data including the positions of subfields for the frames, and drawing desired patterns based on the IC chip data as a group of the frame data.

According to the present invention, when an IC pattern data which is output from a design system such as a CAD is expanded to drawing data used in a drawing apparatus with a charged beam, the pattern division in the subfield can greatly be prevented in the case when pattern data of a subfield is present in adjacent frames. Therefore, undesired increase of data can be prevented effectively, drawing time can be reduced, and the throughput including data processing time can greatly be improved. In addition, the generation of micro figures due to subfield pattern division near frame boundaries can be prevented, thereby improving drawing precision.

DETAILED DESCRIPTION OF THE PREFERRED EMBODIMENT

An embodiment of the present invention will now be described in detail with reference to the accompanying drawings.

Figure 1:
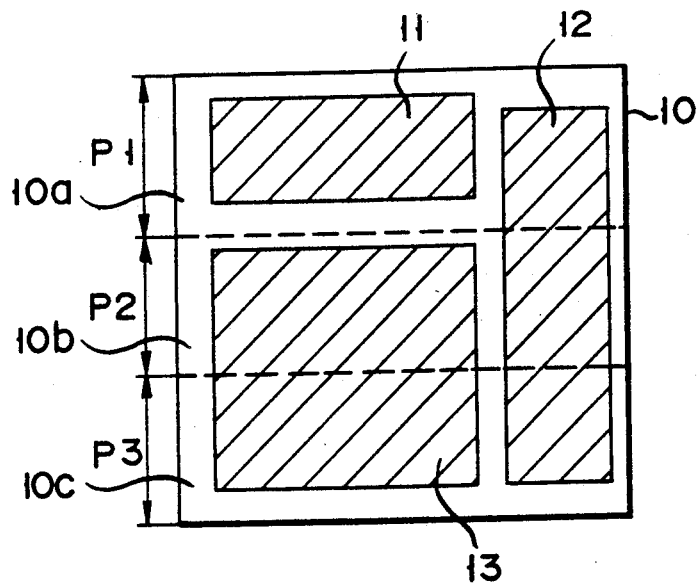
FIG. 1 is a schematic view showing an example of an LSI chip pattern.
Figure 2:
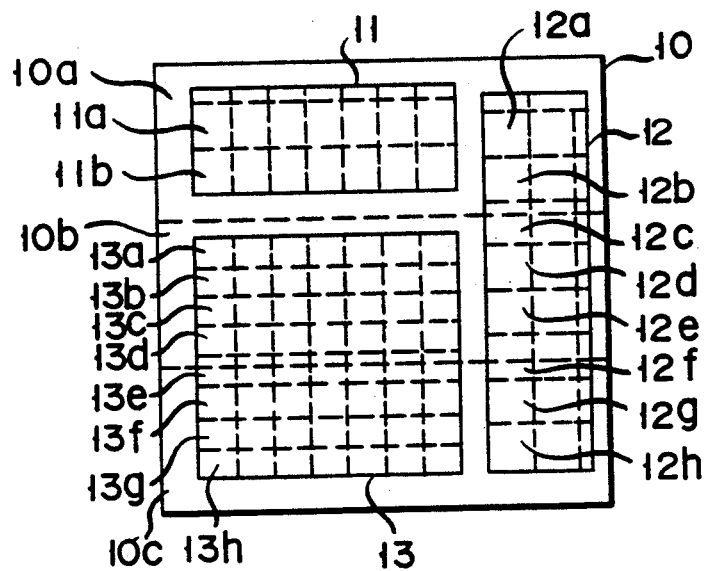
FIG. 2 is a schematic view showing the pattern of FIG. 1 which is divided into frames and subfields for drawing.
Figure 3:
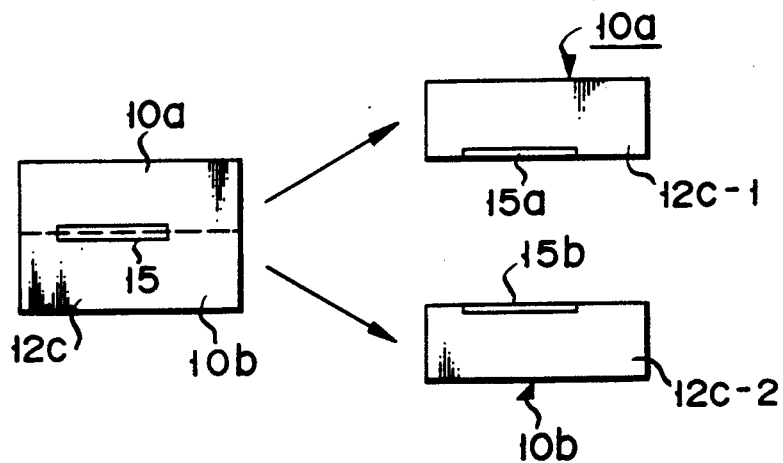
FIG. 3 is a schematic view showing the manner in which the pattern in a subfield is divided by a boundary of adjacent frames.
Figure 4:
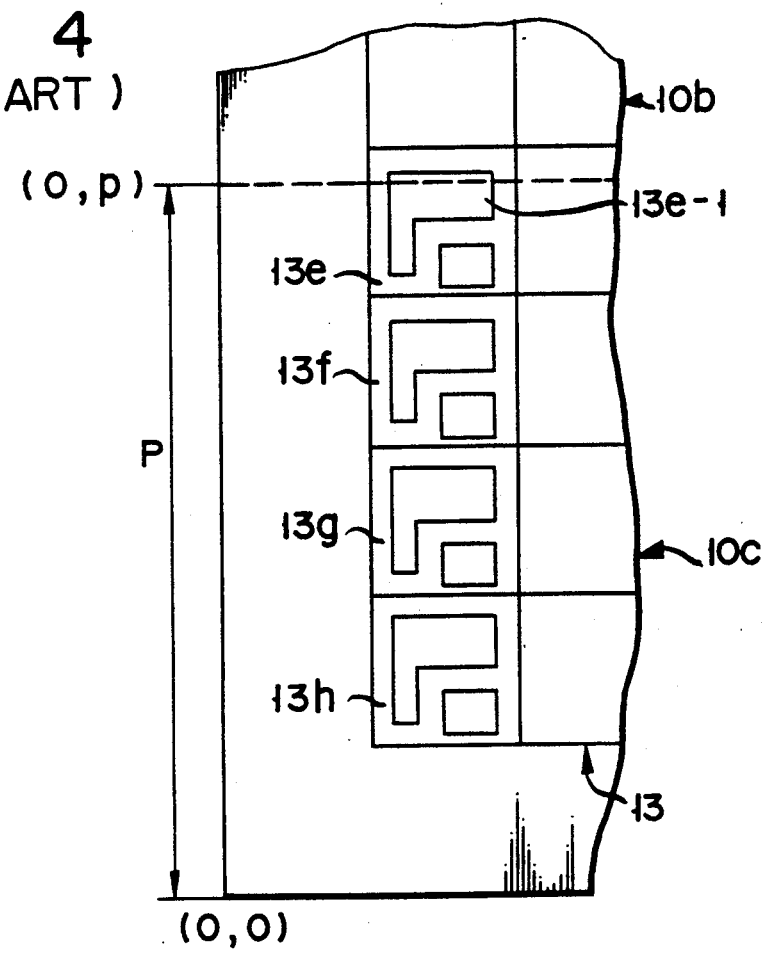
FIG. 4 is an enlarged view showing part of the frame wherein the same pattern is repeated.
Figure 5:
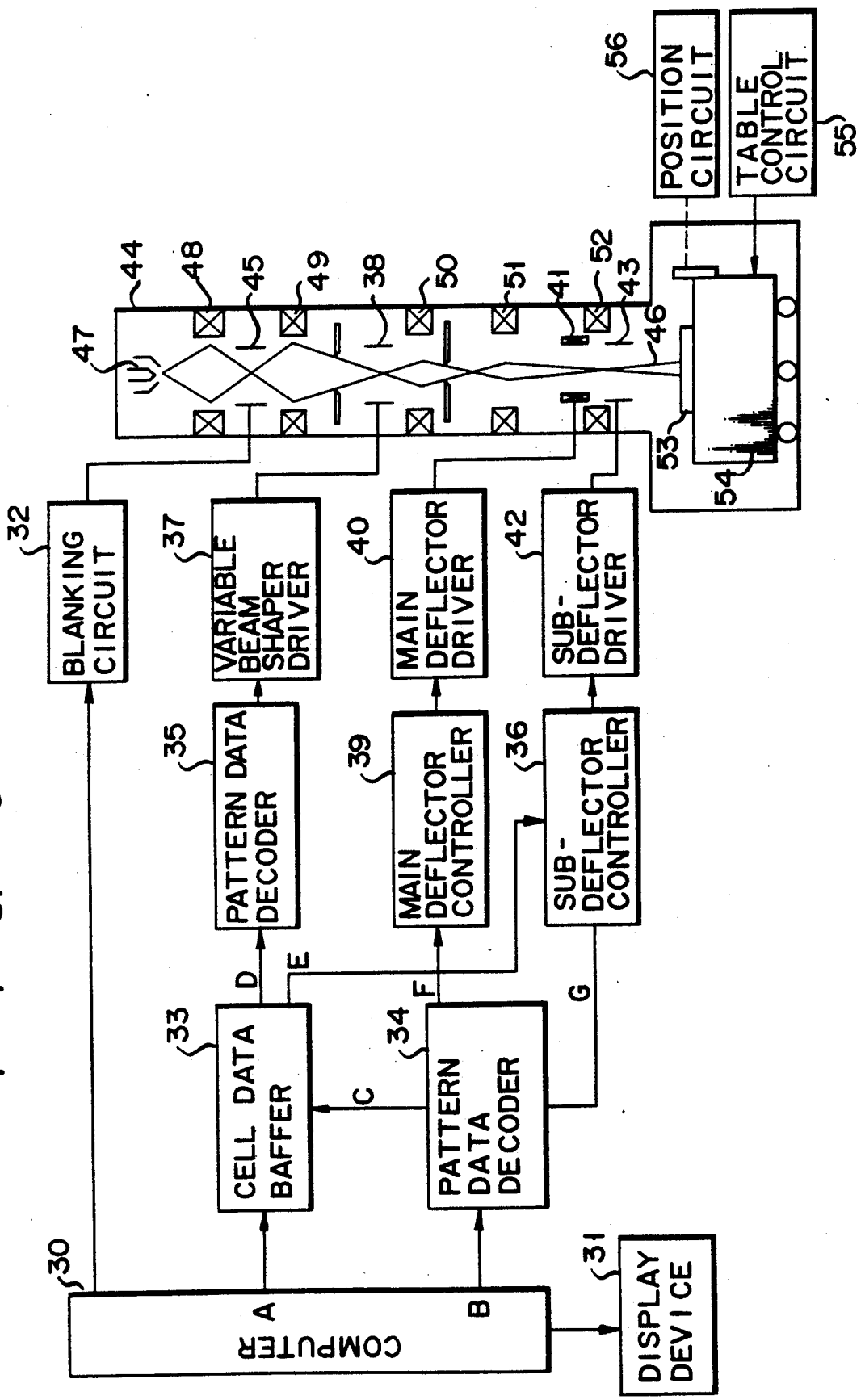
FIG. 5 is a block diagram showing a drawing apparatus with an electron beam used for carrying out a method of drawing according to the present invention.

Referring to FIG. 5, pattern data which is output from computer 30 is supplied to display device 31 to display an IC pattern to be drawn and is also supplied to blanking circuit 32, cell data buffer 33, and pattern data decoder 34 through a pattern memory (not shown), a deflection control circuit (not shown), and the like. Among pattern data, cell data name data C is supplied to cell data buffer 33 and designated cell data is read out from buffer 33. Among cell data read out from buffer 33, pattern data D is supplied to pattern data decoder 35 and cell size data E is supplied to subdeflector controller 36. Decoder 35 decodes pattern data D to supply desired beam size data to variable beam generator driver 37. A predetermined deflection signal is applied to variable beam generator 38 in electron beam optical system 44 from driver 37 to control the sectional beam shape of the electron beam.

On the other hand, decoder 34 decodes subfield number data F and offset data G according to pattern drawing data B. Subfield number data F is supplied to main deflector controller 39 and offset data G is supplied to subdeflector controller 36. Controller 39 decodes subfield number data F to supply positioning data of the subfield to main deflector driver 40. A predetermined deflection signal is applied from driver 40 to main deflector 41 having electromagnetic coils, and an electron beam is deflected and scanned at a designated subfield. In addition, controller 36 generates a subdeflector scanning control signal according to cell size E and offset data G, and supplies the control signal to subdeflector driver 42. A predetermined subdeflection signal is applied from driver 42 to subdeflector 43 having electrostatic deflection plates, thereby performing drawing at each subfield. In response to blanking data, at this time, blanking circuit 32 supplies a blanking signal to blanking device 45 in system 44 to perform blanking control of electron beam 46. Beam 46 is emitted from electron gun 47 in system 44 and shaped by shaping lenses 48 to 52. Semiconductor wafer or sample 53 is irradiated with the focused electron beam 46. Sample 53 is placed on table 54 and driven by table control circuit 55 such that the position thereof is controlled. Position detection of table 54 is performed by position circuit 56 using a laser. Circuits 55 and 56 are also connected to and controlled by computer 30.

A method of drawing an LSI pattern using the above apparatus will now be described with reference to FIGS. 6 to 13.

Figure 6:
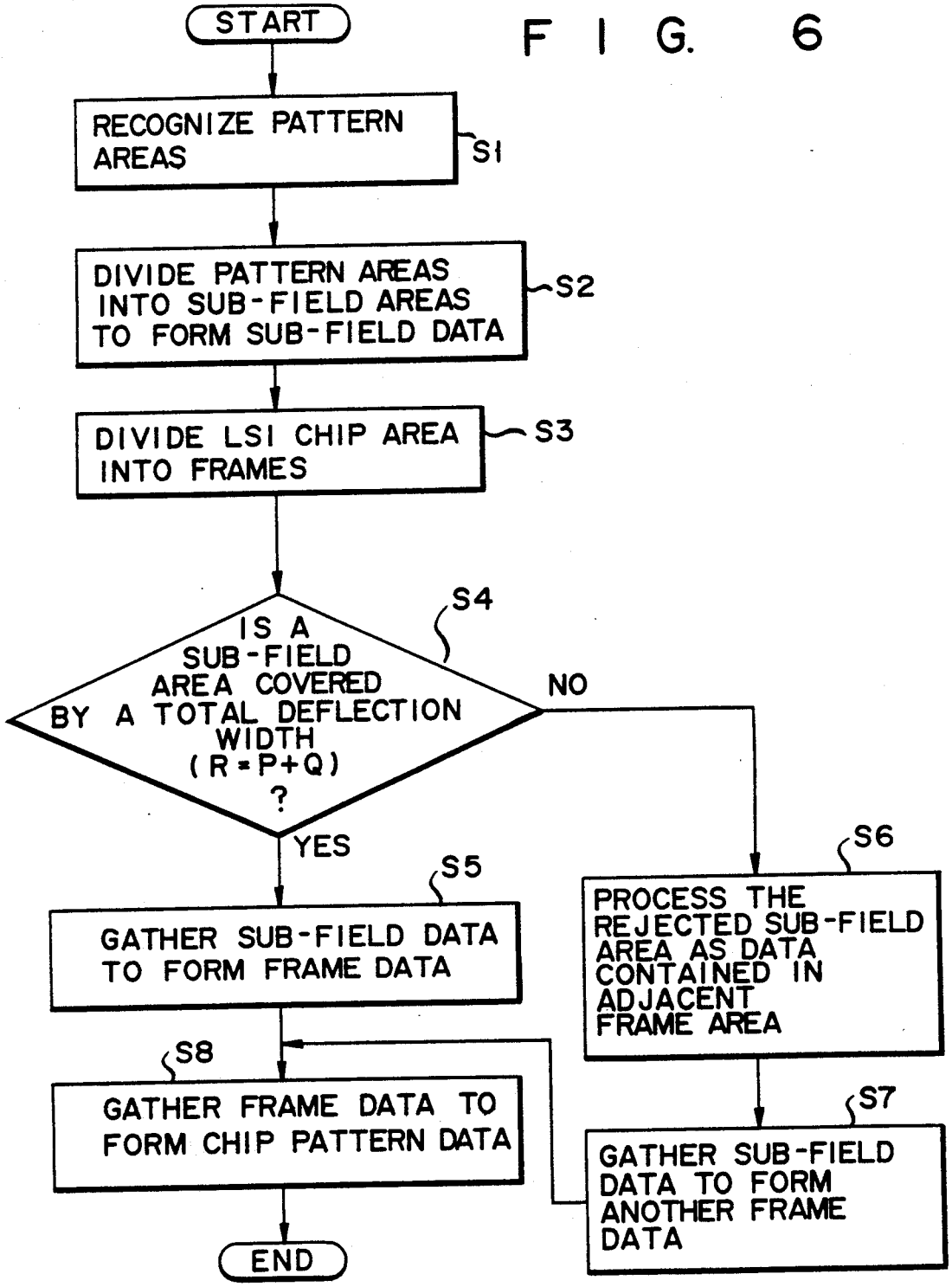
FIG. 6 is a flow chart showing a pattern drawing method of the present invention.
Figure 7:
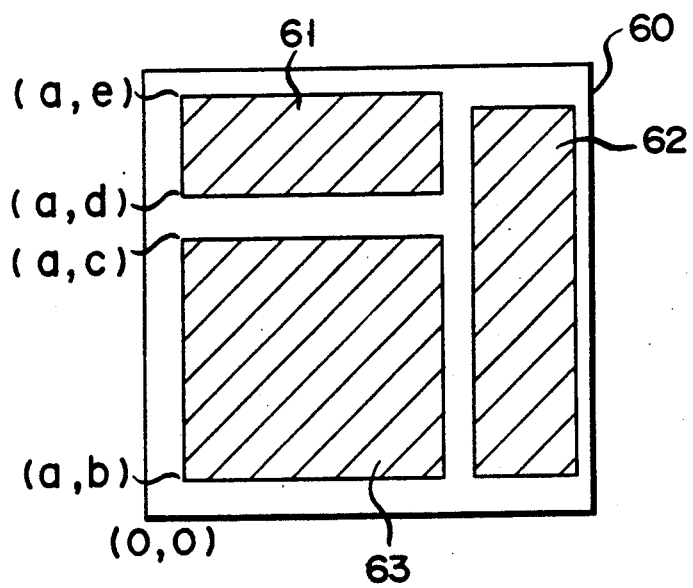
FIG. 7 shows one example of an LSI chip pattern being drawn according to a method of this invention.
Figure 8:
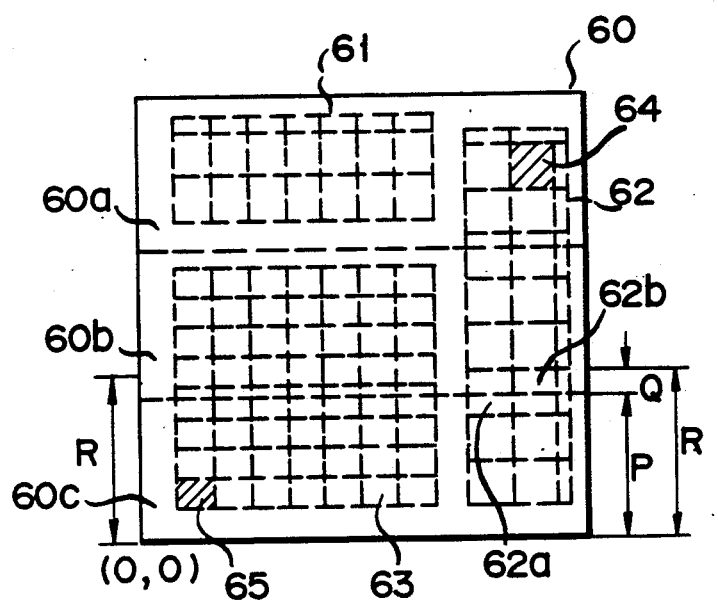
FIG. 8 is a schematic view showing the pattern of FIG. 7 which is divided into frames and subfields for drawing.
Figure 9:
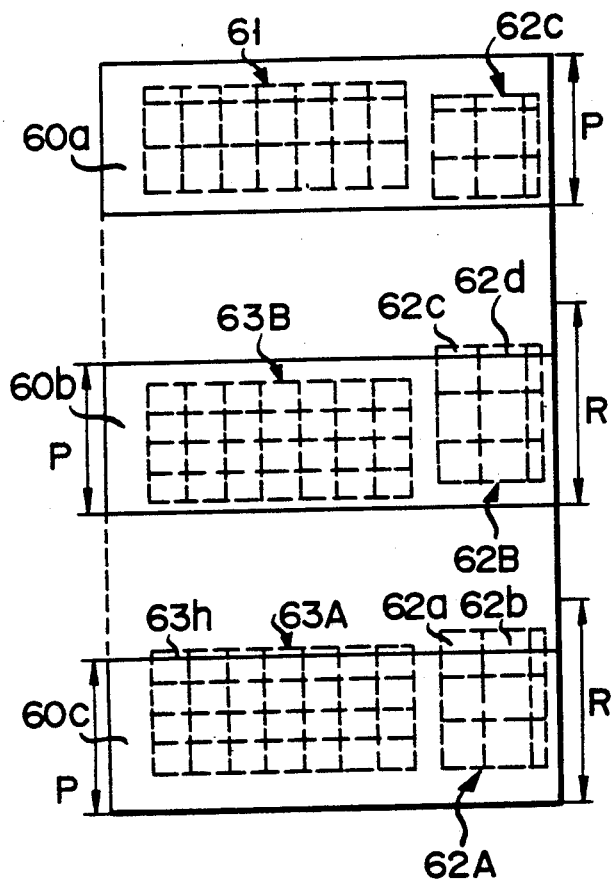
FIG. 9 is a view showing a pattern of FIG. 8 divided into frames.
Figure 10:
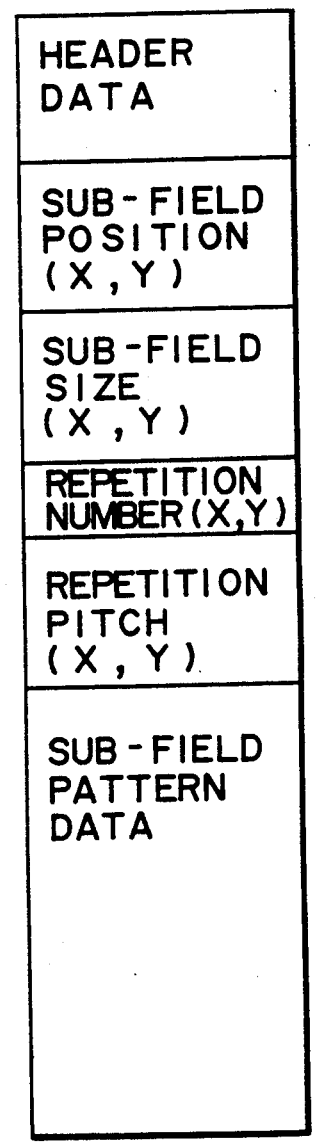
FIG. 10 is a view showing contents of repetition pattern data included in patterns of FIGS. 7 to 9.

FIG. 6 is a flow chart showing generation procedures of LSI chip pattern data used in the above apparatus, and FIGS. 7 to 12 are schematic views showing a system in which LSI chip data is generated in accordance with the flow chart shown in FIG. 6. First, based on a CAD output data on which pattern regions 61 to 63 are arranged as shown in FIG. 7, pattern regions 61 to 63 are recognized in step S1 of FIG. 6. An operator visually checks the above procedure on the basis of a pattern displayed on display device 31 of FIG. 5 as well as a designed chart of LSI chip 60 and repetition data in CAD data. At this time, repetition data (number of repetitive patterns and repetition pitch) corresponding to a repetition pattern represented by the pattern of memory element in FIG. 11, for example, is obtained by the operator. In FIG. 7, reference numeral 60 denotes an LSI chip area; 61 and 62, nonrepetitive regions; and 63, a repetitive region. An example of the data format of the repetition data is shown in FIG. 10.

Figure 11:
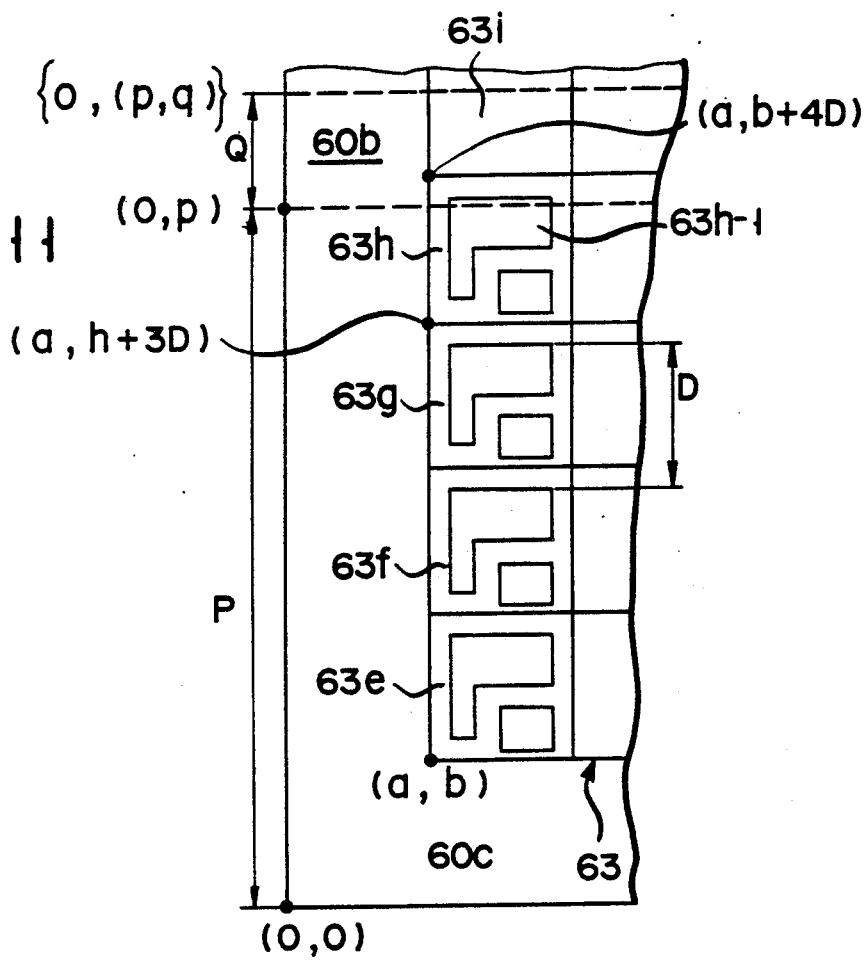
FIG. 11 shows a relationship between main deflection width, subfield width and a repetition pattern.

Next, as shown in FIG. 8, regions 61 and 62 are divided into subfields of maximum size 64 which can be drawn by subdeflector 43 to generate subfield data in accordance with drawing pattern data included in the subfields. On the other hand, for repetitive region 63, the size of the subfield is determined in accordance with the size of pattern region as a unit repetition pattern. As can be seen in FIG. 11, the subfield size is equal to the repetition pitch D of the pattern. For example, when maximum subdeflection width is 30 $\mu$m and repetition pattern pitch D is 16 $\mu$m which is known on the design drawings, the subdeflection width for drawing this subfield should be set at 16 $\mu$m.

Subsequently, as shown in FIG. 8, chip area 60 is virtually divided into logical frames which are determined by deflection width P of main deflector 41, and maximum physical frame width R (=P+Q) which is determined by deflection width P of deflector 41 and deflection width Q of subdeflector 43 is virtually set. In addition, as shown in FIG. 9, frame data as a set of subfield groups in which a drawing start position of the subfield is included in the logical frame and an end position thereof is included in maximum physical frame width R is acquired for frame regions 60a to 60c.

For repetition region 63, data compression is performed according to the number of repetitive patterns and repetition pitch to constitute frame data. When frame regions 60a to 60c of LSI chip 60 are drawn, the subfield position is controlled by driver 40 through controller 39 and the position of drawing figure is determined by driver 42 through controller 36 without dividing subfields present at a boundary between adjacent frames. At the same time, the beam spot size is controlled by driver 37 to draw the pattern by a shot system.

The above operation will now be described in more detail.

Referring to FIG. 7, the data of the lower left corner point of chip pattern 60 supplied from computer 30 is given as (0,0), and the lower left corner point of pattern region 63 is given as (a,b). Accordingly, as shown in FIG. 11, when region 63 is divided into subfields 63e to 63h, 63i,..., the start point of subfield 63e is also given as (a,b). Similarly, start points of subfields 63f to 63i are respectively simply calculated by computer 30 using pitch data D to be (a,b+D), (a,b+2D), (a,b+3D), and (a,b+4D).

If pattern region 63 is divided into frames by main deflection width P as shown in FIG. 11 in step S3 of FIG. 6, the upper left corner point of frame region 60c is given as (0,p). On the other hand, the upper left corner point of subfield 63h, i.e., the start point of subfield 63i is given as (a,b+4D). The computer 30 compares two points (a,b+4D) and (0,p) and determines that an upper portion of subfield 63h extends from frame 60c into 60b. However, in step S4 of FIG. 6, computer 30 checks if an upper end point (a,b+4D) of subfield 63h has coordinate values smaller than those of an upper end point {0,(p+q)} as total deflection width R=P+Q of main deflection width P and subdeflection width Q. If YES in step S4 of FIG. 6, all pattern data of subfield 63h is processed as data included in frame 60c. Among other subfields included in frame 60c, computer 30 performs the above determination for all subfields extending into frame 60b. As a result, in step S5, all pattern data of the subfields as data included in frame 60c is acquired, and data of frame 60c is determined. As is apparent from FIG. 8, a plurality of subfields at a lower portion of pattern region 62 are included in frame 60c. The same determination as for subfield 63h of FIG. 11 is performed by computer 30 for subfield regions 62a and 63b, and it is determined whether pattern data of regions 62a and 62b is included in frame 60c.

As is apparent from FIG. 9, since all subfields of pattern 61 and the subfields of upper region 62C of pattern 62 are included in main deflection width P, all these subfield regions are used to constitute frame data for frame 60a.

As all subfields of upper region 63B of pattern 63 are included in the range of main deflection width P of frame 60b, this subfield data can be processed as data in frame 60b. Among subfield regions included in intermediate region 62B of pattern 62, upper portions of regions 62c and 62d extend into adjacent frame 60a. Therefore, computer 30 determines whether regions 62c and 62d fall within maximum physical frame width R (=P+R) as in the case of subfield 63h. In this case, all pattern data in regions 62c and 62d is processed as included in frame 60b.

If a subfield region falls outside total deflection width R (=P+Q) and NO in step S4, this subfield should be processed in step S6 as included in a given frame region adjacent to the corresponding frame. All other subfield data to be included in the given frame is acquired in step S7, and data of the given frame is constituted.

Frame data 60a to 60c is produced as described above and acquired in step S8 in FIG. 6, and data for pattern drawing is constituted.

Figure 12:
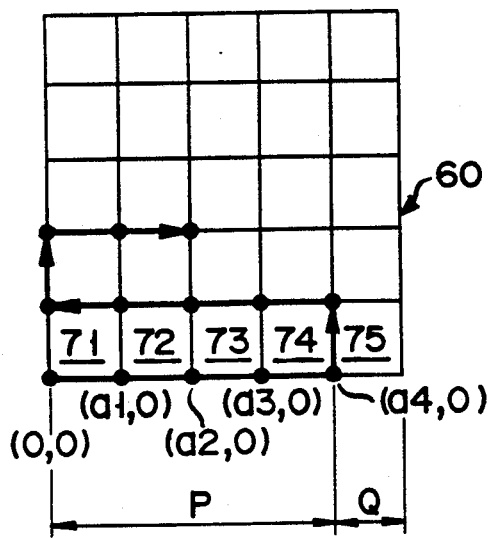
FIG. 12 shows a relationship between a frame width and subfield width in a double deflection system.

In the above description, the lower left corner of chip 60 is given as origin (0,0). As shown in FIG. 12, beam start positions corresponding to the respective subfield regions are given as lower left corner points (a1,0) and (a2,0) of field regions 71, 72,..., by main deflector 41. For example, to draw a pattern of subfield region 71 with a beam, main deflector 41 sets the start position of beam 46 at origin (0,0), and subdeflector 43 performs necessary pattern drawing in region 71. The start position of beam 46 is then set at point (a3,0) representing the start position of subfield 74, and subdeflector 43 performs necessary pattern drawing in region 74. As shown in FIG. 12, when a start point which gives main deflection width P is a start point of subdeflection of each of subfields 71, 72,..., effective deflection width can be increased by subdeflection width Q at only one side of the main deflection region to determine maximum frame width R.

Figure 13:
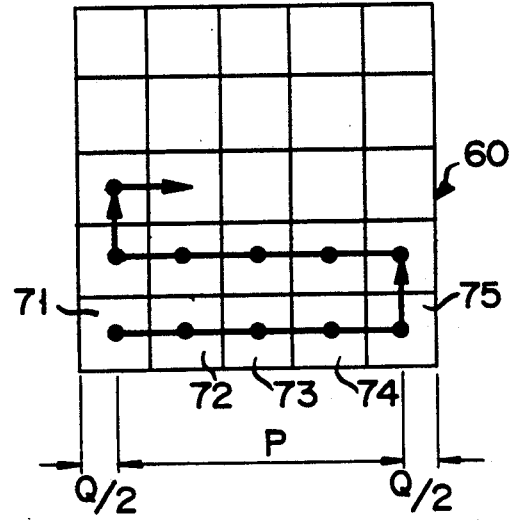
FIG. 13 shows a relationship between a frame width and a subfield width in another double deflection system.

On the contrary, as shown in FIG. 13, when a start position of beam 46 which is determined by main deflector 41 is a central point of each of regions 71 to 75,..., effective deflection width can be increased by Q/2 at both sides of the main deflection region P to determine maximum frame width R. Therefore, in frame division with frame width R, even if parts of regions 71 and 75 extend into an adjacent frame, all patterns of regions 71 and 75 can be processed as frame pattern data as long as each extended portion falls within the range of Q/2.

As a result of such drawing, drawing processes can be performed based on subfield data and frame data which are generated without impairing regularity of the repetition pattern. More specifically, LSI pattern data can be compressed and the drawing time can be shortened. As a result, a large increase in throughput including the data process frame can be achieved, and factors for drawing errors generated by pattern division can be reduced.

According to the embodiment of the present invention, an LSI chip area is divided into subfields and then virtually divided into frames to constitute frame data as a group of subfield data including subfields in the frames. Therefore, an increase in throughput and an improvement in drawing precision can be achieved. The present invention will contribute to future LSI micropatterning and higher integration.

The present invention is not limited to the above embodiment, and various changes and modifications may be made without departing from the spirit and scope of the present invention. For example, an arrangement of the drawing apparatus with an electron beam is not limited to that of FIG. 5 but can be changed in accordance with specifications as needed. In addition, the apparatus can also be applied to a method of drawing with an ion beam instead of an electron beam.

Further, the width of subfield is not required to be set equal to that of subdeflection, and the width can be set less than that of the subdeflection. The main deflector of electromagnetic type is used in the embodiment, but an electrostatic type main deflector, such as electrostatic deflection plates or a deflector of eight poles can also be used.

What is claimed is:

1. A method of drawing an IC pattern on a predetermined substrate with a charged beam, the IC pattern including at least a repetitive pattern block array having a plurality of same-sized continuous repetitive pattern blocks each having at least one same pattern and including at least one non-repetitive pattern block array including a plurality of different pattern blocks, comprising the steps of:

dividing a region of the substrate for forming the IC pattern into a plurality of subfield regions each including a reference position for the charged beam determined by a main deflection device of the charged beam, said subfield regions being determined by a subdeflection width of the charged beam;

dividing the region of the substrate into a plurality of virtual frames which are determined by the main deflection width of the charged beam;

(determining a size of a first subfield in the repetitive pattern block array so that the size of the firs subfield corresponds to that of each of the same-sized repetitive pattern blocks:)

determining a size of the second subfield in the non-repetitive pattern block array so that each of the second subfields has a size corresponding to maximum subdeflection width of the charged beam;

determining whether the reference position of each of said subfield regions is included in one of said virtual frames so that each subfield residing at a boundary of two adjacent frames is distributed to either of the two adjacent frames;

constituting pattern drawing subfield data by using a unit pattern data of said same-sized repetitive pattern blocks, a number of the repetitive pattern blocks included in the frame and arranged in the main deflection width and pitch data representing a pitch between adjacent same-sized repetitive pattern blocks;

processing pattern data of the subfield having the at least one pattern extending into an adjacent frame as data which is included in the range of the one of said virtual frames according to a result of the distribution determination process;

combining the constituted frame data for pattern drawing to form an IC pattern data;

positioning the charged beam at the reference position of each subfield by the main deflection device; and drawing a desired at least one pattern on the predetermined substrate based on the formed pattern drawing subfield data by a subdeflection device in units of subfield regions.

2. A method according to claim 1, which further comprises the steps of controlling a charged beam sectional shape and/or size by a beam generation means, while drawing is performed by said charged beam.

3. A method according to claim 1, wherein the reference position of the subfield is one selected from a center portion of the subfield and a corner portion of said subfield.

* * * * *